(12) United States Patent
Chen

(10) Patent No.: US 11,057,037 B2
(45) Date of Patent: Jul. 6, 2021

(54) TOUCH SWITCH

(71) Applicant: Yu Ta Chen, Taichung (TW)

(72) Inventor: Yu Ta Chen, Taichung (TW)

( * ) Notice: Subject to any disclaimer, the term of this patent is extended or adjusted under 35 U.S.C. 154(b) by 77 days.

(21) Appl. No.: 16/702,498

(22) Filed: Dec. 3, 2019

(65) Prior Publication Data

US 2021/0167779 A1 Jun. 3, 2021

(51) Int. Cl.
*H03K 17/96* (2006.01)

(52) U.S. Cl.
CPC .............. *H03K 17/9627* (2013.01); *H03K 2217/96015* (2013.01)

(58) Field of Classification Search
CPC ............. H03K 17/9627; H03K 2217/96015
USPC .................................................. 250/214 SW
See application file for complete search history.

(56) References Cited

U.S. PATENT DOCUMENTS

| | | | | |
|---|---|---|---|---|
| 9,025,919 B2* | 5/2015 | Sullivan | ................. | G02F 1/015 385/40 |
| 2013/0242552 A1* | 9/2013 | Chien | ................ | F21V 11/06 362/235 |
| 2014/0111467 A1* | 4/2014 | Chen | ................... | G06F 3/0445 345/174 |

* cited by examiner

*Primary Examiner* — Tomi Skibinski
(74) *Attorney, Agent, or Firm* — Bradley J. Thorson; DeWitt LLP

(57) ABSTRACT

A touch switch includes a light-pervious plate, a first peripheral frame, a second peripheral frame and an electrical switch module. The light-pervious plate has a predetermined shape. The first peripheral frame corresponds in shape to the light-pervious plate. One side face of the first peripheral frame is coupled to one side face of the light-pervious plate. The second peripheral frame corresponds in shape to of the first peripheral frame. One side face of the second peripheral frame is coupled to another side face of the first peripheral frame. The electrical switch module corresponds in shape to the second peripheral frame. One side face of the electrical switch module is coupled to another side face of the second peripheral frame. The side face of the electrical switch module is provided with at least one light sensitive switch.

14 Claims, 4 Drawing Sheets

TOUCH SWITCH

FIELD OF THE INVENTION

The present invention relates to an electrical switch, and more particularly to a touch switch.

BACKGROUND OF THE INVENTION

Generally, a wall-mounted electrical switch includes a base and a panel. The base is coupled to an opening of the wall. The inner side face of the base is connected with the wires inside the wall. The outer side face of the base is provided with a push switch or a toggle switch. The panel is coupled to the outer side face of the base to shield the opening of the wall. The push switch or the toggle switch is exposed to the panel for a user to turn on or off the electrical appliance to which the base is connected.

As to the above-mentioned conventional electrical switch, due to the frequent use of the push switch or the toggle switch, the circuit contacts or the positioning engaging structure may wear out and lose its switching effect. Moreover, the panel is a simple plastic panel without any decorative and visual effect.

SUMMARY OF THE INVENTION

The primary object of the present invention is to provide a touch switch that is more durable in use.

Another object of the present invention is to provide a touch switch that has a visually better optical effect.

A further object of the present invention is to provide a touch switch that has a diversified panel.

In order to achieve the above objects, a touch switch is provided. The touch switch comprises a light-pervious plate, a first peripheral frame, a second peripheral frame and an electrical switch module that are arranged in sequence. The light-pervious plate has a predetermined shape. An outer edge of the first peripheral frame corresponds in shape to an outer edge of the light-pervious plate. One side face of the first peripheral frame is coupled to one side face of the light-pervious plate. An outer edge of the second peripheral frame corresponds in shape to the outer edge of the first peripheral frame. One side face of the second peripheral frame is coupled to another side face of the first peripheral frame. An outer edge of the electrical switch module corresponds in shape to the outer edge of the second peripheral frame. One side face of the electrical switch module is coupled to another side face of the second peripheral frame. Wherein, the side face of the electrical switch module, facing the light-pervious plate, is provided with at least one light sensitive switch for activating the light sensitive switch on another side face of the light-pervious plate.

Embodiments of the present invention will now be described, by way of example only, with reference to the accompanying drawings.

DESCRIPTION OF THE PREFERRED EMBODIMENTS

Figure 1:
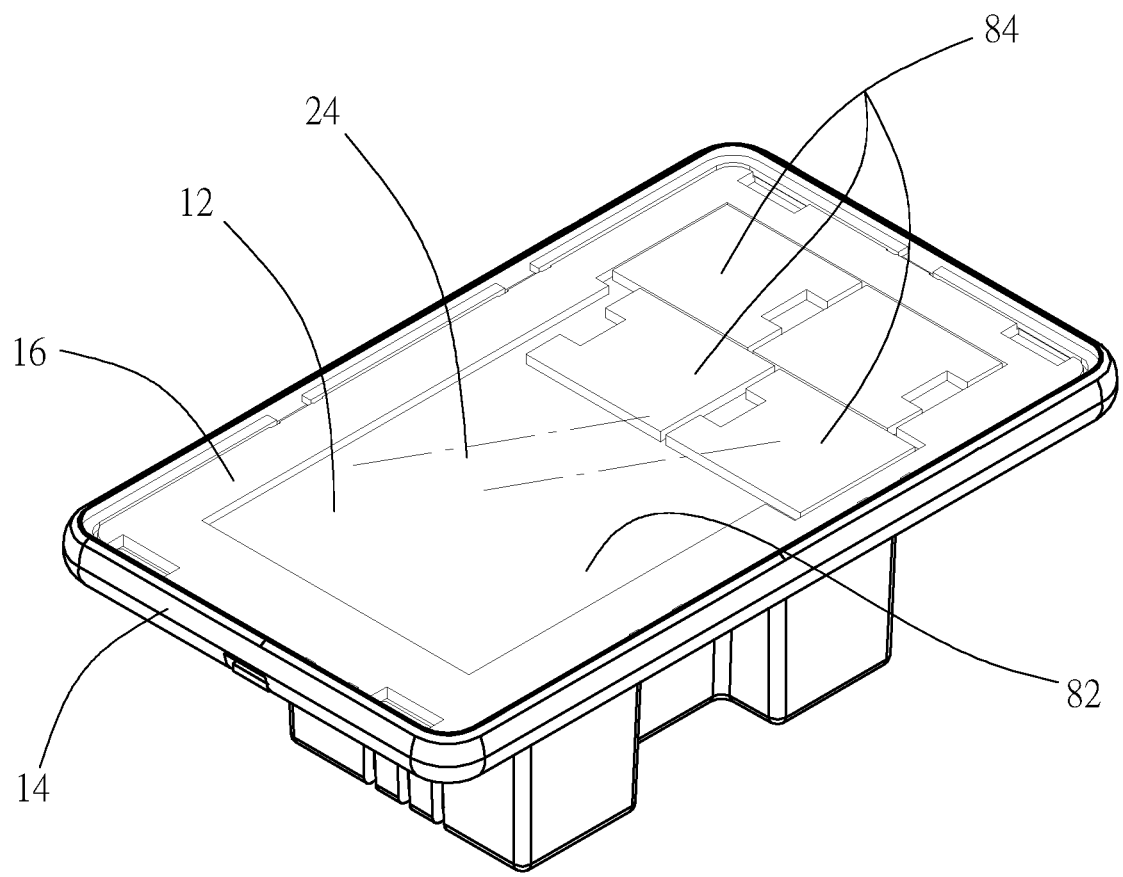
FIG. 1 is a perspective view in accordance with a first embodiment of the present invention.
Figure 2:
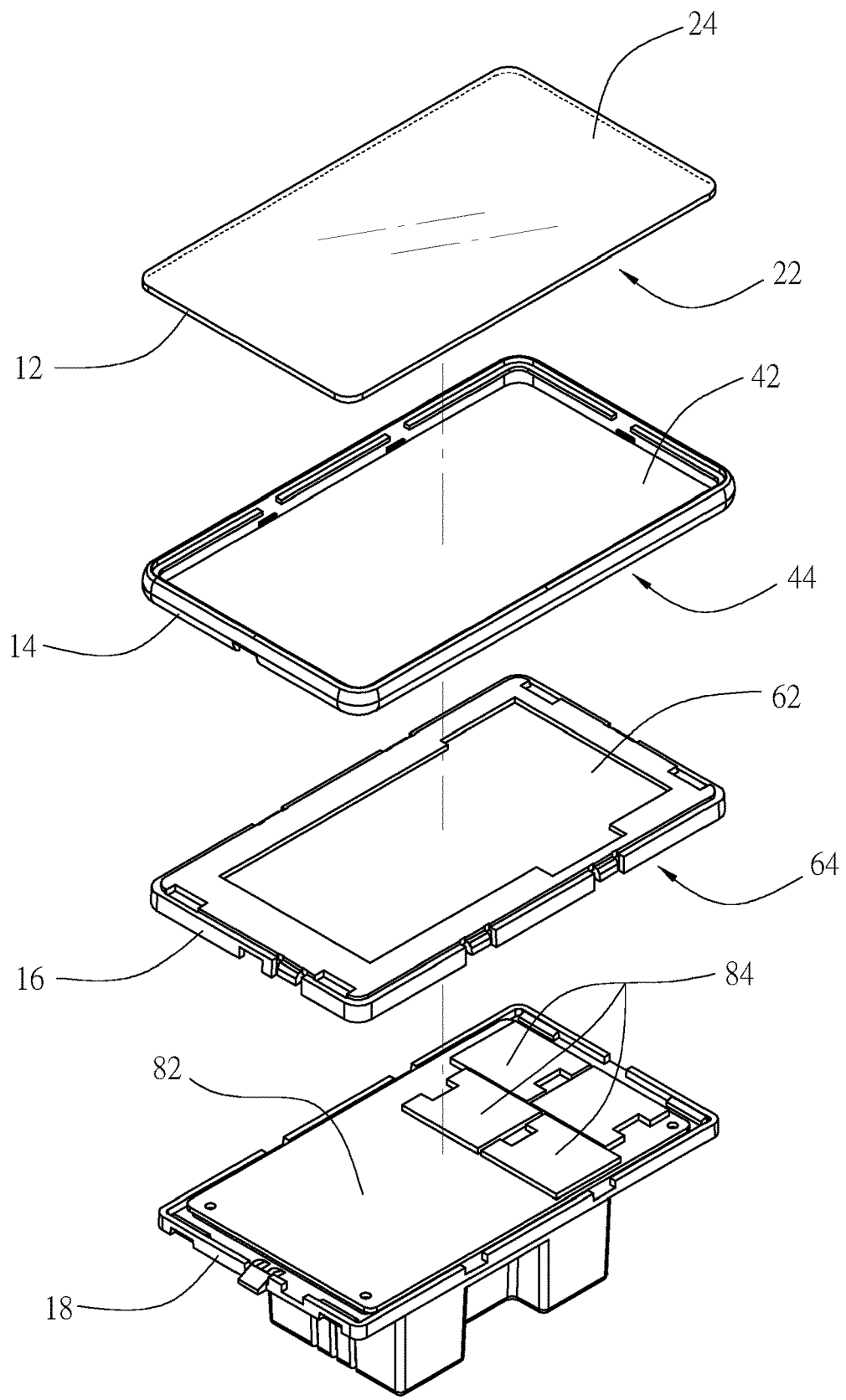
FIG. 2 is an exploded view of FIG. 1.

Referring to FIG. 1 and FIG. 2, a touch switch of the present invention comprises a light-pervious plate 12, a first peripheral frame 14, a second peripheral frame 16 and an electrical switch module 18 that are arranged in sequence.

The light-pervious plate 12 has a predetermined shape, such as a rectangular shape with four curved corners, a polygonal shape, or a circular shape (not shown). The light-pervious plate 12 may be made of a glass material.

The first peripheral frame 14 may be made of a metal aluminum material. In this embodiment, the inner edge of the first peripheral frame 14 corresponds in shape to the outer edge of the light-pervious plate 12. The periphery of one side face 42 of the first peripheral frame 14 is glued or inlayed to the periphery of one side face 22 of the light-pervious plate 12.

The second peripheral frame 16 may be made of a thermoplastic polymer material, such as Acrylonitrile Butadiene Styrene (ABS). In this embodiment, the outer edge of the second peripheral frame 16 corresponds in shape to the inner edge of the first peripheral frame 14. The periphery of one side face 62 of the second peripheral frame 16 is glued or inlayed to the periphery of another side face 44 of the first peripheral frame 14.

In this embodiment, the outer edge of the electrical switch module 18 corresponds in shape to the inner edge of the second peripheral frame 16. The periphery of one side face 82 of the electrical switch module 18 is glued or inlayed to the periphery of another side face 64 of the second peripheral frame 16. The side face 82 of the electrical switch module 18, facing the light-pervious plate 12, is provided with at least one light sensitive switch 84. The light sensitive switch 84 is activated in a touch manner on another side face 24 of the light-pervious plate 12.

Figure 3:
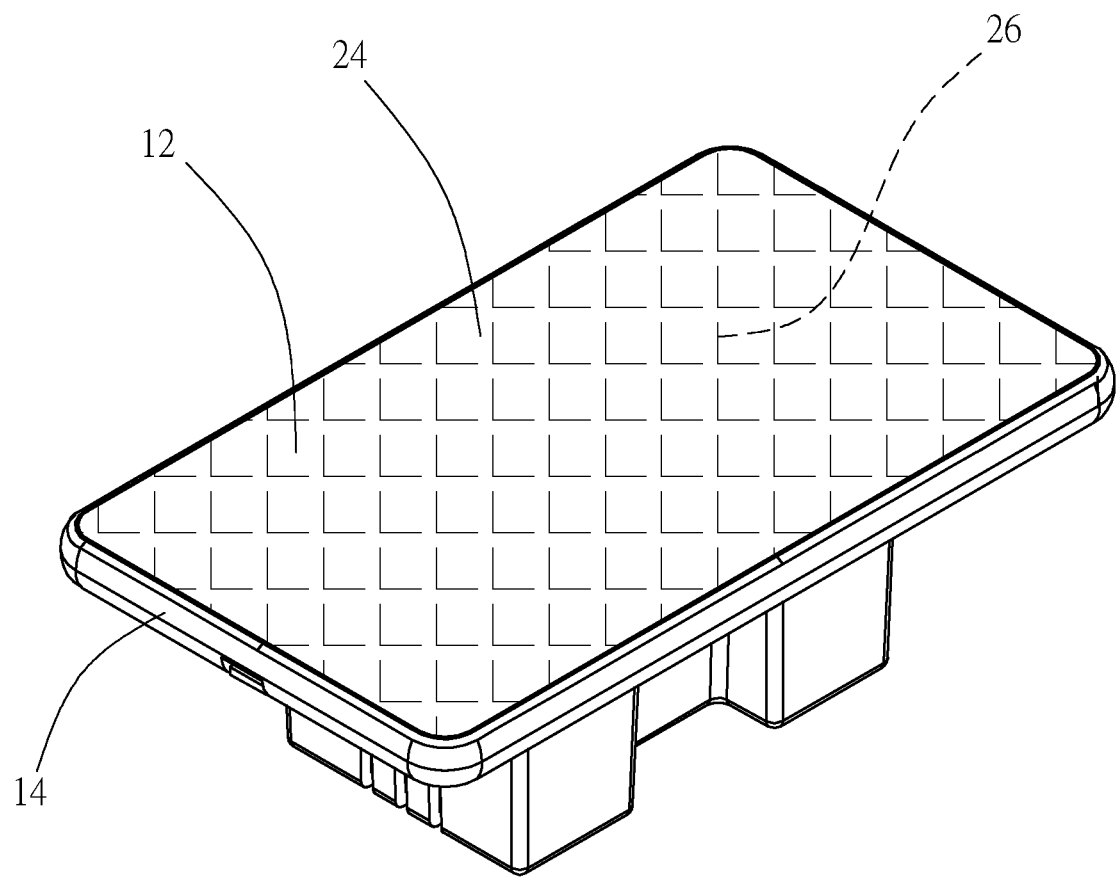
FIG. 3 is a perspective view in accordance with a second embodiment of the present invention.
Figure 4:
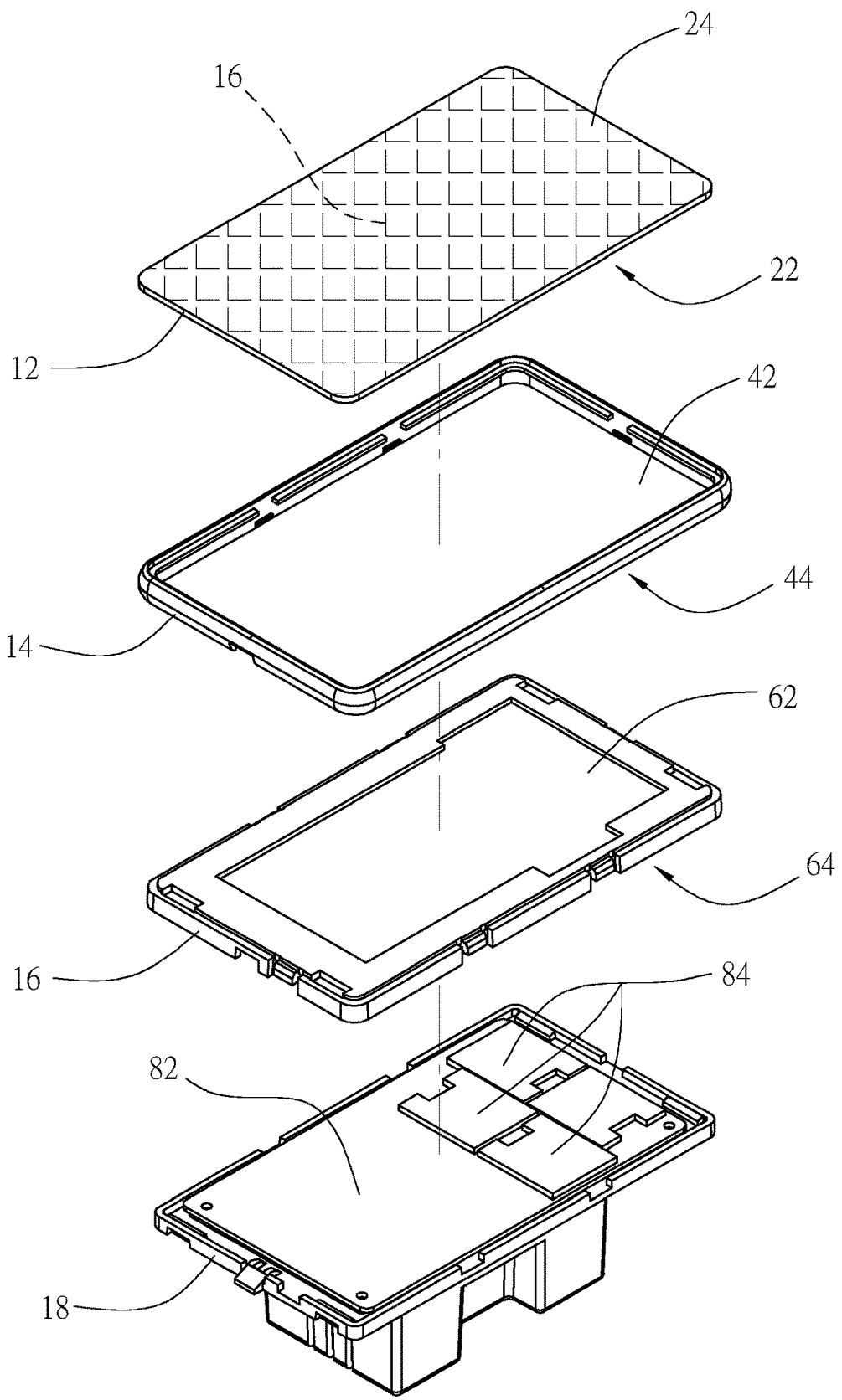
FIG. 4 is an exploded view of FIG. 3.

Referring to FIG. 3 and FIG. 4, the touch switch of the present invention further comprises a pattern 26. The pattern 26 is disposed on the light-pervious plate 12 by adhesive or printing, thereby providing different visual effects. Furthermore, the light-pervious plate 12 of the present invention may be combined with different patterns, that is, the touch switch with a diversified panel can match the decoration of a room or building. The pattern 26 may be disposed on the side face 22 of the light-pervious plate 12 between the light-pervious plate 12 and the first peripheral frame 14, so that the visual effect of the side face 24 of the light-pervious plate 12 further highlights the optical effect.

In the present invention, the adhesive may be selected from epoxy resin adhesive (epoxy resin and curing agent are mixed together) or optical clear adhesive (OCA).

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A touch switch, comprising:
   a light-pervious plate, a first peripheral frame, a second peripheral frame and an electrical switch module that are arranged in sequence;
   the light-pervious plate having a predetermined shape;
   the first peripheral frame corresponding in shape to the light-pervious plate, one side face of the first peripheral frame being coupled to one side face of the light-pervious plate;

the second peripheral frame corresponding in shape to the first peripheral frame, one side face of the second peripheral frame being coupled to another side face of the first peripheral frame;

the electrical switch module corresponding in shape to the second peripheral frame, one side face of the electrical switch module being coupled to another side face of the second peripheral frame; and wherein the side face of the electrical switch module, facing the light-pervious plate, is provided with at least one light sensitive switch for activating the light sensitive switch on another side face of the light-pervious plate.

2. The touch switch as claimed in claim 1, wherein the light-pervious plate is made of a glass material, the first peripheral frame is made of an aluminum material, and the second peripheral frame is made of a thermoplastic polymer material.

3. The touch switch as claimed in claim 2, wherein further comprising a pattern disposed on the light-pervious plate.

4. The touch switch as claimed in claim 3, wherein the pattern is disposed between the light-pervious plate and the first peripheral frame.

5. The touch switch as claimed in any one of claim 4, wherein an inner edge of the first peripheral frame corresponds in shape to an outer edge of the light-pervious plate, an outer edge of the second peripheral frame corresponds in shape to the inner edge of the first peripheral frame, and an outer edge of the electrical switch module corresponds in shape to an inner edge of the second peripheral frame.

6. The touch switch as claimed in any one of claim 3, wherein an inner edge of the first peripheral frame corresponds in shape to an outer edge of the light-pervious plate, an outer edge of the second peripheral frame corresponds in shape to the inner edge of the first peripheral frame, and an outer edge of the electrical switch module corresponds in shape to an inner edge of the second peripheral frame.

7. The touch switch as claimed in any one of claim 2, wherein an inner edge of the first peripheral frame corresponds in shape to an outer edge of the light-pervious plate, an outer edge of the second peripheral frame corresponds in shape to the inner edge of the first peripheral frame, and an outer edge of the electrical switch module corresponds in shape to an inner edge of the second peripheral frame.

8. The touch switch as claimed in claim 1, wherein the light-pervious plate has a rectangular shape with four curved corners.

9. The touch switch as claimed in any one of claim 8, wherein an inner edge of the first peripheral frame corresponds in shape to an outer edge of the light-pervious plate, an outer edge of the second peripheral frame corresponds in shape to the inner edge of the first peripheral frame, and an outer edge of the electrical switch module corresponds in shape to an inner edge of the second peripheral frame.

10. The touch switch as claimed in claim 1, further comprising a pattern disposed on the light-pervious plate.

11. The touch switch as claimed in claim 10, wherein the pattern is disposed between the light-pervious plate and the first peripheral frame.

12. The touch switch as claimed in any one of claim 11, wherein an inner edge of the first peripheral frame corresponds in shape to an outer edge of the light-pervious plate, an outer edge of the second peripheral frame corresponds in shape to the inner edge of the first peripheral frame, and an outer edge of the electrical switch module corresponds in shape to an inner edge of the second peripheral frame.

13. The touch switch as claimed in any one of claim 10, wherein an inner edge of the first peripheral frame corresponds in shape to an outer edge of the light-pervious plate, an outer edge of the second peripheral frame corresponds in shape to the inner edge of the first peripheral frame, and an outer edge of the electrical switch module corresponds in shape to an inner edge of the second peripheral frame.

14. The touch switch as claimed in any one of claim 1, wherein an inner edge of the first peripheral frame corresponds in shape to an outer edge of the light-pervious plate, an outer edge of the second peripheral frame corresponds in shape to the inner edge of the first peripheral frame, and an outer edge of the electrical switch module corresponds in shape to an inner edge of the second peripheral frame.

* * * * *